United States Patent [19]

Choi

[11] Patent Number: 5,964,599
[45] Date of Patent: Oct. 12, 1999

[54] LOCKING PERIPHERAL PORT COVER FOR PREVENTING ACCIDENTAL DETACHMENT OF PERIPHERAL DEVICE FROM A COMPUTER SYSTEM

[75] Inventor: Phil-Kyu Choi, Suwon, Rep. of Korea

[73] Assignee: SamSung Electronics Co., Ltd., Suwon, Rep. of Korea

[21] Appl. No.: 08/923,094

[22] Filed: Sep. 4, 1997

[30] Foreign Application Priority Data

Sep. 4, 1996 [KR] Rep. of Korea ...................... 96-38282

[51] Int. Cl.⁶ ...................................................... H05K 7/10
[52] U.S. Cl. ............................................. 439/135; 361/684
[58] Field of Search ..................................... 361/680, 684, 361/683, 686; 439/135, 136; 429/96, 97

[56] References Cited

U.S. PATENT DOCUMENTS

| | | |
|---|---|---|
| 5,019,465 | 5/1991 | Herron et al. . |
| 5,060,990 | 10/1991 | Smith et al. ................................ 292/91 |
| 5,208,116 | 5/1993 | Joh . |
| 5,321,580 | 6/1994 | Hosoi et al. ............................. 361/684 |
| 5,508,569 | 4/1996 | Nishino . |
| 5,808,861 | 9/1998 | Nakajima et al. ...................... 361/680 |
| 5,901,035 | 5/1999 | Foster et al. ............................ 361/683 |

*Primary Examiner*—Neil Abrams
*Assistant Examiner*—Michael C. Zarroli
*Attorney, Agent, or Firm*—Robert E. Bushnell, Esq.

[57] ABSTRACT

This invention relates to a peripheral port cover that interlocks with a peripheral port so that it cannot be accidentally opened by the movement of a peripheral device. This prevents the accidental separation of peripheral devices from the computer and the corresponding data and power losses that occur.

13 Claims, 3 Drawing Sheets

LOCKING PERIPHERAL PORT COVER FOR PREVENTING ACCIDENTAL DETACHMENT OF PERIPHERAL DEVICE FROM A COMPUTER SYSTEM

CLAIM FOR PRIORITY

This application makes reference to, incorporates the same herein, and claims all rights accruing thereto under 35 U.S.C. §119 through my patent application entitled Table Computer Having a Door for Assembling/Disassembling a Peripheral Device earlier filed in the Korean Industrial Property Office on the 4th day of Sep. 1996 and there duly assigned Ser. No. 1996/38282.

BACKGROUND OF THE INVENTION

1. Field of the Invention

The present invention relates to a portable computer having a locking peripheral port cover and, more particularly, to a portable computer having a peripheral port cover that is resistant to motion of a peripheral device attached to the computer without a device-specific safety device.

2. Background Art

A typical peripheral device is attached through a peripheral port on a computer and is prevented from accidentally separating from the computer by a safety device, such as a rib on the bottom or on the side of the computer. The extra space required for mounting a specific peripheral safety device is becoming an increasingly difficult design problem as computers are being built progressively more compactly due to increasing technological demands. Many computers are capable of interfacing with a wide variety of peripheral devices, thus providing computer users with greater freedom in the selection of additional peripheral devices for their computers. This has led to the development of different ways to prevent a peripheral device, or more specifically, a battery from accidentally disconnecting from a computer peripheral slot.

By way of example, U.S. Pat. No. 5,508,569 to Nishino entitled Battery Driven Equipment having a Locking Mechanism, shows a battery locking mechanism for portable computers that uses a plunger which is built into the peripheral port and connects into a recess in the battery to secure it in place. U.S. Pat. No. 5,208,116 to Joh entitled Battery Locking Apparatus For Portable Personal Computer, mentions a locking mechanism that works in conjunction with a specially shaped battery to lock in the battery. U.S. Pat. No. 5,019,465 to Herron entitled Locking Arrangement for a Battery Pack, shows a battery pack that is latched to the bottom of a laptop computer.

However, I have observed that when a peripheral device, or battery, is used that does not fit perfectly inside a peripheral port, the peripheral unit tends to move around and thereby causes the peripheral port cover to open. This can result in the accidental interruption of computer power, a loss of data, and damage to the peripheral device. I have found that what is needed, but so far unaddressed by the art, is a new safety restraint for peripheral devices, which utilizes only the cover of a peripheral port, that is simple to manufacture, and that is useful with a variety of different types of peripheral devices, rather than only one brand or type of peripheral device, and which takes up little space inside the computer.

SUMMARY OF THE INVENTION

It is an object of the present invention to provide a restraining device for peripheral devices attached to a computer system.

It is another object to provide a restraining device which is built into the cover of the peripheral port.

It is yet another object to provide a restraining device that is economical and simple to manufacture.

It is still another object to provide a restraining device which is usable with a variety of different peripheral devices.

It is still yet another object to provide a restraining device which can prevent the loss of power to a computer, and the corresponding loss of data, which occurs when a battery slides out of a peripheral port.

It is a further object to provide a restraining device that occupies little space inside a computer system.

These and further objects are achieved by using a peripheral port cover which locks into place. The simple design of the peripheral port cover makes it economical and simple to manufacture. By locking the cover into position one prevents an ill-fitting peripheral device from sliding out of a peripheral port. The use of a cover to restrain a peripheral device, rather than using a device-specific restraint, allows various size peripheral devices to be prevented from accidentally separating from a computer. I expect that avoiding accidental separation between a computer and its peripheral device will also prevent sudden power and data losses.

BRIEF DESCRIPTION OF THE DRAWINGS

A more complete appreciation of this invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE PREFERRED EMBODIMENTS

Figure 1:
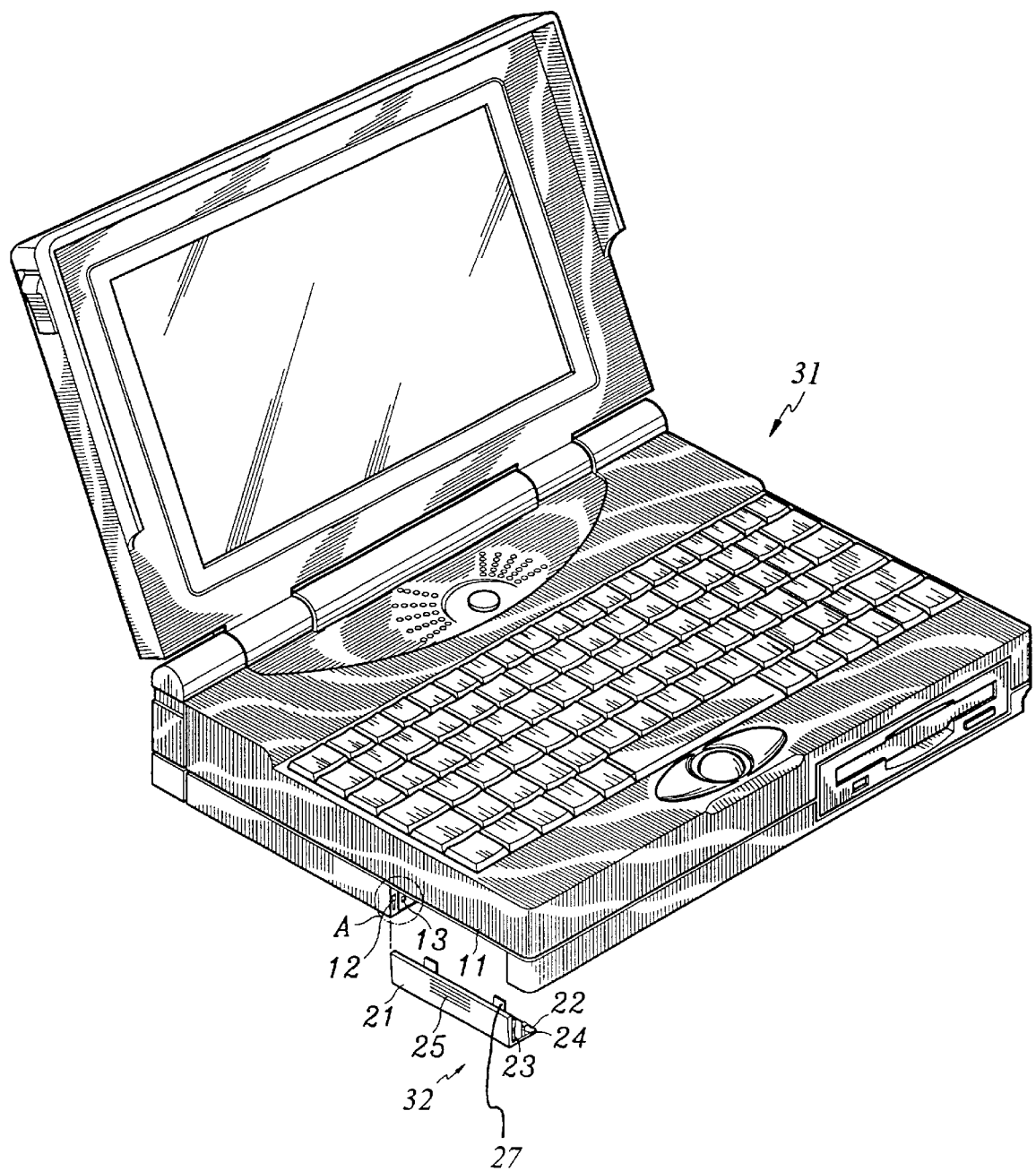
FIG. 1 is a perspective view showing a lap top with an open peripheral port.

Turning now to the drawings, particularly FIG. 1, that figure illustrates a lap top computer 31 with an open peripheral port 11 and the corresponding peripheral port cover 32. The port cover 32 is generally constructed using two panels which are joined along an edge. One panel 22 is parallel to the base of the lap top and the second panel 21 is perpendicular to the first panel 22. The cover 32 has a thumb grip 25 and two protrusions 27 for engaging the peripheral port. The area denoted 'A' shows the cover engagement features on one side of the laptop's peripheral port. The engagement features include a guiding ridge 12 and a receiving recess 13. The guiding ridge 12 mates with the groove 26 adjacent to the inner lip 23 of the port cover and prevents it from opening in a direction parallel to the base of the lap top. The recess 13 receives catch 24, which is attached to the port cover 32, thus, preventing the port cover 32 from opening in a direction perpendicular to the base of the laptop.

Figure 2:
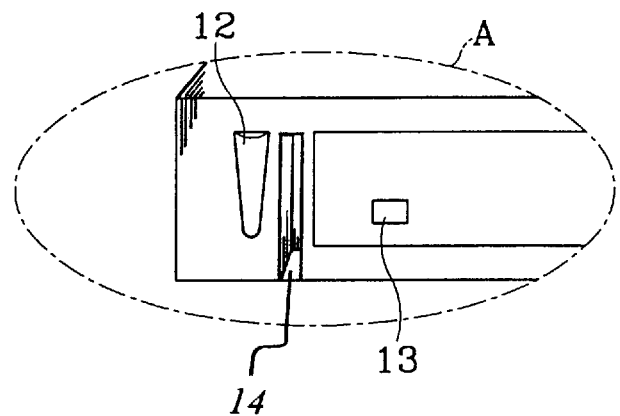
FIG. 2 is a magnification view of area 'A', from FIG. 1, which shows the connectors attached to one side of the interior of the peripheral port: the connectors engaging the peripheral port cover.
Figure 3:
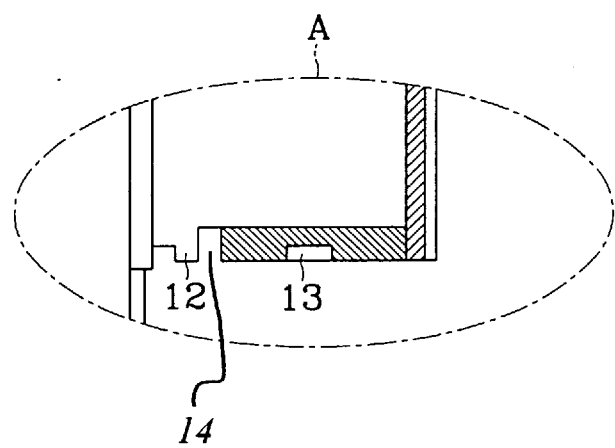
FIG. 3 is a top cross-sectional view of area 'A'.
Figure 5:
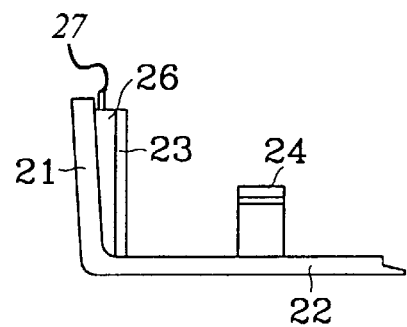
FIG. 5 is a side view of the peripheral port cover.

As shown in FIG. 2, the guiding ridge 12 is narrow at the bottom and gets wider towards the top. This makes it easier to engage the guiding ridge 12 with the groove 26 (FIG. 5) on the port cover 32. FIG. 3 shows a top cross sectional view of area 'A'. The inner lip 23 of the port cover 32 mates with the deeper recess 14 adjacent to guiding ridge 12.

Figure 4:
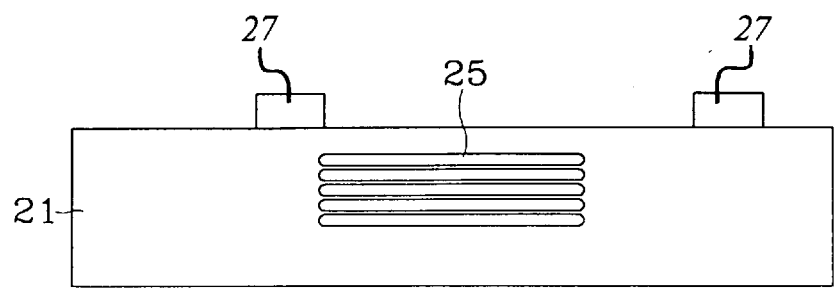
FIG. 4 is a front view of the peripheral port cover, showing its upper protrusions and its outer thumb grip.

The thumb grip 25, shown in FIG. 4, is located on the panel 21 which is perpendicular to the base of the lap top. The thumb grip 25 is comprised of parallel ridges on the outer surface of the panel 21. The ridges 25 allow for enough frictional contact between the user's finger and the cover 32 to prevent the user's finger from slipping when disengaging the peripheral port cover 32 from the laptop. The upper protrusions 27 mate with recesses (not shown) in the upper surface of the peripheral port opening 11.

Figure 6:
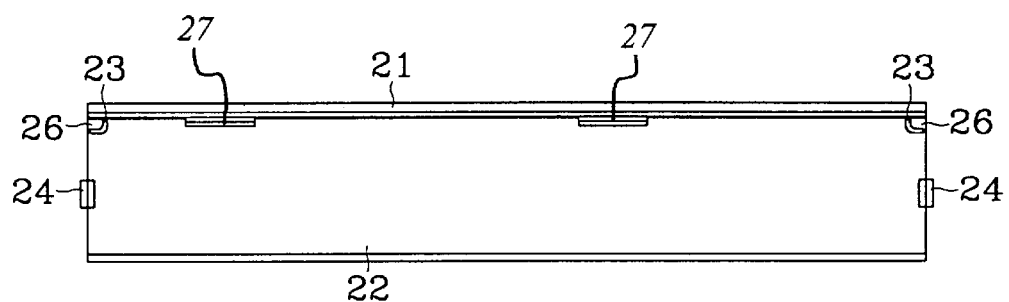
FIG. 6 is a plan view of the peripheral port cover.
Figure 7:
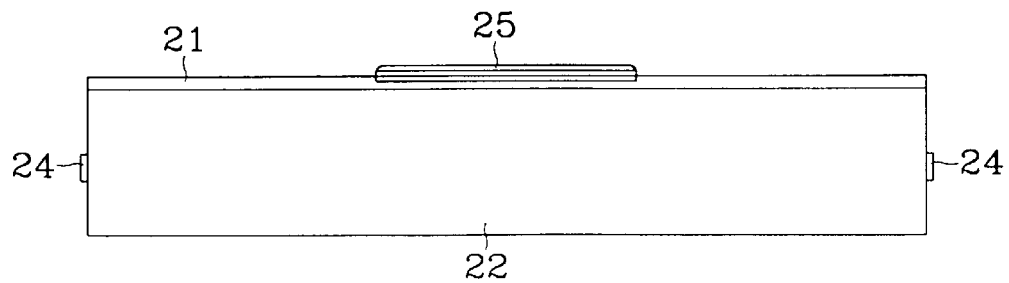
FIG. 7 is a rear view of the peripheral port cover.

To attach the peripheral port cover 32 to the laptop 31, the user aligns the guiding ridge 12 with the groove 26 (FIGS. 5 and 6), which consequently aligns lip 23 and recess 14. Then the cover 32 is slid into engagement with the peripheral port and the upper protrusions 27 engage the recesses (not shown) in the peripheral port. The catch 24 simultaneously engages with the recess 13 in the side of the peripheral port while the cover 32 is pushed into place. Once the peripheral port cover 32 is fully engaged with the lap top 31, it will not open in a direction parallel to the base of the lap top 31 because of the guiding ridge 12 and groove 26 interface. The peripheral cover 32 does not open in a direction perpendicular to the base of the lap top because of the engagement between the upper protrusions 27 and the recesses (not shown) in the upper surface of the peripheral port and because of the engagement between the catches 24, located along the panel parallel to the base of the lap top, and the recesses 13 in the side of the peripheral port.

When disengaging the peripheral port cover 32 from the peripheral port 11 one applies pressure to the thumb grip 25 and thereby disengages the peripheral port cover 32 from the laptop 31. Once the peripheral port cover 32 is removed, the current peripheral device can be swapped with another peripheral device.

This new peripheral device restraining cover is economical and simple to manufacture. It is capable of use with a variety of peripheral devices and utilizes only the cover of the peripheral port. This device will prevent the accidental opening of a peripheral port cover when a peripheral device moves inside a computer. Although one preferred embodiment of the present invention has been disclosed for illustrative purposes, those skilled in the art will appreciate that various modifications, additions and substitutions are possible, without departing from the scope and spirit of the invention as disclosed in the accompanying claims. It is also possible that other benefits or uses of the currently disclosed invention will become apparent over time.

What is claimed is:

1. A peripheral port for receiving a peripheral device, comprising:

an interior surface adapted to receive said peripheral device;

a plurality of guiding ridges protruding from interior opposing side surfaces of said peripheral port and oriented in a direction perpendicular to a bottom of said peripheral port, said peripheral port having a first plurality of recesses formed in said opposing side surfaces and adjacent to said guiding ridges, said peripheral port having a second plurality of rectangular recesses formed in said opposing side surfaces of said peripheral port; and a cover detachable from said peripheral port and enclosing said peripheral device inside said peripheral port, said cover having a first panel connected along an edge to a second panel perpendicular to said first panel, said first panel being parallel to said guiding ridges when said cover encloses said peripheral device inside said peripheral port, said first panel having a plurality of grooves formed in side edges of said first panel for receiving said guiding ridges, said first panel having lips extending along sides of said first panel, said first panel having at least one protrusion on an upper portion of said first panel, said second panel having a plurality of catches;

wherein said at least one protrusion engages at least one upper surface recess in said peripheral port, said plurality of grooves engage said guiding ridges, said lips engage said first plurality of recesses, and said plurality of catches engage said second plurality of rectangular recesses, when said cover encloses said peripheral device in said peripheral port.

2. A peripheral port according to claim 1, said cover having a plurality of protruding ridges forming a thumb grip on an outer surface of said first panel to increase friction between the cover and a user's finger.

3. A portable computer system having a peripheral port for receiving a peripheral device, comprising:

a body containing a central processing unit;

a peripheral port which is recessed into said body, said peripheral port having an interior surface that forms a rectangular cavity for receiving said peripheral device;

a cover that engages said peripheral port, said cover having a top portion that protrudes inside said peripheral port when said cover is engaged with said peripheral port, said top portion having at least one upper protrusion formed therein for engaging an upper surface of said peripheral port;

a plurality of guiding ridges protruding from interior side surfaces of said peripheral port and oriented in a direction perpendicular to a bottom of said peripheral port;

a plurality of grooves formed in and extending from side edges of said cover for engaging said guiding ridges, said plurality of grooves having a V-shape and being wider at a top than at a bottom thereof; and a plurality of catches attached to said cover, said catches engaging recesses in said interior surface of said peripheral port.

4. A portable computer system according to claim 3, said cover having a plurality of protruding ridges formed on an outer surface of said cover to allow easier removal of said cover by a user's finger.

5. A portable computer system having a peripheral port for receiving a peripheral device, comprising:

a body containing a central processing unit;

a peripheral port which is recessed into said body, said peripheral port having interior top, bottom and side surfaces forming a rectangular cavity for receiving said peripheral device;

a cover that engages said peripheral port, said cover having a panel that is located inside said peripheral port when said cover is engaged with an entrance of said peripheral port, said panel having at least one upper protrusion for engaging the interior top surface of said peripheral port, said panel having first side surface portions forming lips extending into first recesses in the interior side surfaces of said peripheral port, and second side surface portions forming grooves for receiving guiding ridges formed in the interior side surfaces of said peripheral port; and a plurality of catches attached to said cover, said catches engaging second recesses in said interior side surfaces of said peripheral port.

6. A portable computer system according to claim 5, said guiding ridges having a V-shape and being wider at an upper end than at a lower end so as to easily connect with said groove of said cover, said grooves having a V-shape corresponding to said V-shape of said guiding ridges.

7. A portable computer system according to claim 5, said cover having a plurality of protruding ridges on an outer surface of said cover to allow easier removal of said cover by a user's finger.

8. A peripheral port according to claim 1, wherein said guiding ridges are located nearest a front of said port, said first plurality of recesses are located on a side of said guiding ridges remote from said front of said port, and said second plurality of rectangular recesses are located on a side of said first plurality of recesses remote from said front of said port.

9. A peripheral port according to claim 1, wherein said plurality of grooves are located nearest a front of said cover, said lips are located on a side of said plurality of grooves remote from said front of said cover, and said plurality of catches are located on a side of said lips remote from said front of said cover.

10. A portable computer system according to claim 3, wherein said plurality of guiding ridges are located nearest a front of said peripheral port, and recesses in said interior surface of said peripheral port are located on a side of said guiding ridges remote from said front of said peripheral port.

11. A portable computer system according to claim 3, wherein said plurality of grooves are located nearest a front of said cover, and said plurality of catches are located on a side of said plurality of grooves remote from said front of said cover.

12. A portable computer system according to claim 5, wherein said first recesses are located nearest a front of said peripheral port, and said guiding ridges are located on a side of said first recesses remote from said front of said peripheral port.

13. A portable computer system according to claim 5, wherein said lips are located nearest a front of said cover, and said grooves are located on a side of said lips remote from said front of said cover.

* * * * *